United States Patent
Kozak et al.

(10) Patent No.: US 7,719,807 B2
(45) Date of Patent: May 18, 2010

(54) FIELD REPLACEABLE MODULE FOR PROTECTION CIRCUITRY

(75) Inventors: Frederic Michael Kozak, Raleigh, NC (US); Kevin Franklin Casey, Cary, NC (US); Mark Allen Rosen, Hillsborough, NC (US); Milton Palmer Hilliard, Hillsborough, NC (US)

(73) Assignee: Cisco Technology, Inc., San Jose, CA (US)

( * ) Notice: Subject to any disclaimer, the term of this patent is extended or adjusted under 35 U.S.C. 154(b) by 837 days.

(21) Appl. No.: 11/461,985

(22) Filed: Aug. 2, 2006

(65) Prior Publication Data

US 2008/0030931 A1 Feb. 7, 2008

(51) Int. Cl.
*H02H 3/00* (2006.01)
*H02H 3/20* (2006.01)
*H02H 9/04* (2006.01)
*H02H 3/08* (2006.01)
*H01C 7/12* (2006.01)
*H02H 1/00* (2006.01)

(52) U.S. Cl. .................. 361/79; 361/91.1; 361/93.1; 361/119

(58) Field of Classification Search .................. None
See application file for complete search history.

(56) References Cited

U.S. PATENT DOCUMENTS

| 5,745,321 | A | 4/1998 | Faure |
| 6,198,233 | B1 | 3/2001 | McConaughy |
| 6,618,231 | B2 | 9/2003 | McConaughy |
| 6,636,404 | B1 * | 10/2003 | Whitney et al. ............. 361/111 |
| 6,788,510 | B2 | 9/2004 | McConaughy |
| 6,903,910 | B1 | 6/2005 | Griesing et al. |
| 7,082,022 | B2 * | 7/2006 | Bishop ........................ 361/119 |
| 7,280,655 | B2 * | 10/2007 | Dickens et al. .............. 379/412 |

* cited by examiner

*Primary Examiner*—Stephen W Jackson
*Assistant Examiner*—Dharti H Patel
(74) *Attorney, Agent, or Firm*—P. A. Su (57) ABSTRACT

Methods and apparatus for enabling internal circuitry associated with a device to be efficiently replaced in an operating environment for the device are disclosed. According to one aspect of the present invention, a device includes an enclosure that defines an interior of the device, and a circuit arrangement that is located in the interior. A data port interface is located in the interior, and the device also includes a receptacle and a protection circuitry arrangement. The receptacle is coupled to the circuit arrangement, and the protection circuitry arrangement provides protection to the circuit arrangement. The protection circuitry arrangement has an interface that is removably coupled to the receptacle such that at least a portion of the protection circuitry arrangement is contained in the interior of the device.

24 Claims, 7 Drawing Sheets

FIELD REPLACEABLE MODULE FOR PROTECTION CIRCUITRY

BACKGROUND OF THE INVENTION

1. Field of Invention

The present invention relates generally to network devices. More particularly, the present invention relates to readily replacing failed protection circuitry in network devices that are used in constrained environments.

2. Description of the Related Art

T1 and E1 line interfaces on telecommunications (telecom) systems, e.g., twisted pair cable systems, are typically protected against voltage and current surges. Standards and regulations, including ITU K.20 and ITU K.21, generally require that line-interface portions of telecom systems include over voltage and over current protection. Circuit components which provide over voltage and over current protection are allowed to fail in a safe manner, and are permitted to be out of service. Once circuit components have failed, either the overall system that includes the circuit components, or an interface linecard that includes the circuit components, is typically returned to an appropriate manufacturer such that the circuit components may be replaced.

In addition to the inconvenience of having to return either an overall system or an interface linecard to a manufacturer for service in the event of a failure of circuit components, there may be instances in which the return of an overall system or an interface linecard is not possible. By way of example, an overall system may be used in a harsh or inaccessible field environment that renders either removing the overall system or opening the overall system to remove an interface linecard highly impractical or even impossible.

Therefore, what is needed is a method and an apparatus that allows protection circuitry associated with telecom systems to be efficiently replaced. That is, what is desired is a system which enables failed protection circuitry associated with a telecom device to be replaced without requiring that all or part of the device be removed from an environment in which the device is deployed.

SUMMARY OF EXAMPLE EMBODIMENTS

The present invention relates to enabling internal circuitry associated with a device to be efficiently replaced in an operating environment for the device. According to one aspect of the present invention, a device includes an enclosure that defines an interior of the device, and a circuit arrangement that is located in the interior. A data port interface is located in the interior, and the device also includes a receptacle and a protection circuitry arrangement. The receptacle is coupled to the circuit arrangement, and the protection circuitry arrangement provides protection to the circuit arrangement. The protection circuitry arrangement has an interface that is removably coupled to the receptacle such that at least a portion of the protection circuitry arrangement is contained in the interior of the device.

Using a field replaceable module, e.g., a field replaceable surge module, to provide over current and over voltage protection circuitry for telecommunications interfaces used with a device allows the circuitry to be readily replaced, even in harsh or otherwise constrained environments. Such a module may be relatively easily accessible from the outside of a device enclosure or box, but may effectively be an internal component with respect to the device enclosure. By allowing a module with failed circuitry to be readily replaced, the need to open a device or physically remove the device from a location in which the device is used may be substantially eliminated.

These and other advantages of the present invention will become apparent upon reading the following detailed descriptions and studying the various figures of the drawings.

BRIEF DESCRIPTION OF THE DRAWINGS

The invention may best be understood by reference to the following description taken in conjunction with the accompanying drawings in which.

DETAILED DESCRIPTION OF THE EMBODIMENTS

When a device, e.g., a network device that is used for telecommunications (telecom) applications, is in need of servicing, the ability to provide service to the device substantially without moving the device or opening the device is desirable. In some instances, a device may be in a constrained environment, or an environment in which it is generally not permissible to either remove or open the device. Hence, particularly for devices in a constrained environment, if there is a failure of circuitry associated with the device, the ability to replace the circuitry while the device is "in field" is crucial.

For devices which include data ports or telecom interfaces, protection circuitry associated with the data ports is generally permitted to fail. By way of example, protection circuitry for T1 and E1 interfaces is allowed to fail in the event of a voltage surge or a current surge. If the protection circuitry is provided in a replaceable module, once the protection circuitry fails, the module with the failed protection circuitry may be removed and replaced with another module, i.e., a module with protection circuitry that is capable of operating. Hence, replacing the failed protection circuitry may be accomplished relatively efficiently in field.

In one embodiment, a replaceable module that contains protection circuitry for a telecom interface of a device may be arranged to be interfaced with a linecard or a circuit board on which other circuitry associated with the device is contained. The interface between the module and the linecard may be such that the module is physically retained within a receptacle and communicably coupled to the other circuitry. The module, when retained within the receptacle, may be substantially within an interior of the device. That is, when the module is inserted in the receptacle, the module and the protection circuitry contained therein are effectively an internal, integral part of the device. As the module is removably coupled to the linecard, although the module is an integral part of the device, the module is replaceable in field.

Figure 1A:
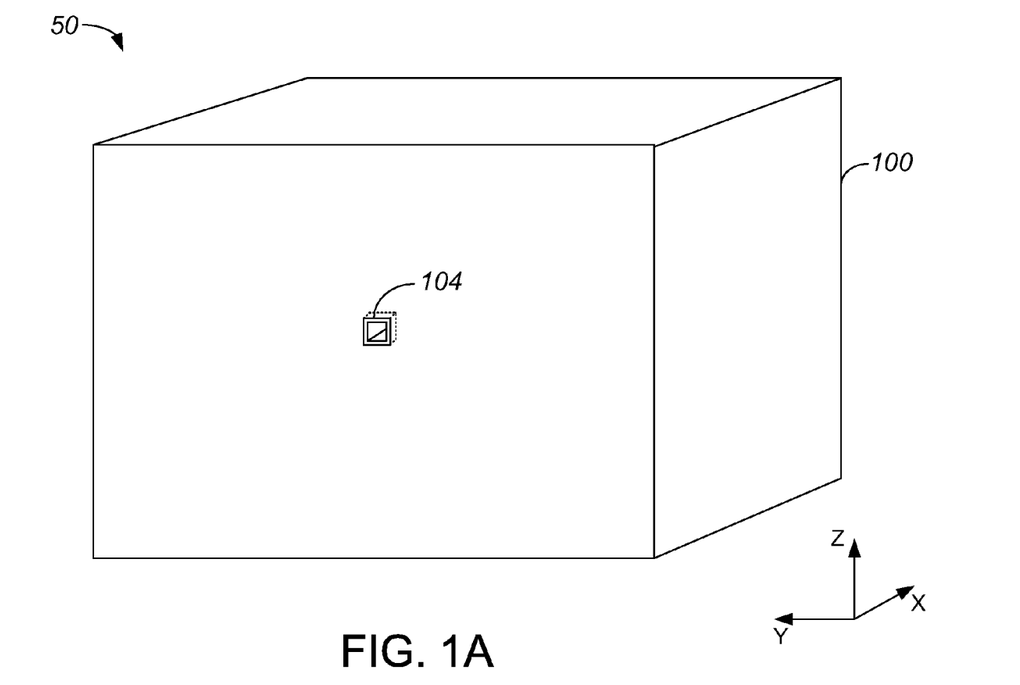
FIG. 1A is a representation of a device with a receptacle that is arranged to receive a module that contains protection circuitry in accordance with an embodiment of the present invention.

Referring initially to FIG. 1A, a device with a receptacle that is arranged to receive a module which contains protection circuitry will be described in accordance with an embodiment of the present invention. A device 50 includes a device enclosure 100 and a receptacle 104 into which a module, i.e., module 150 of FIG. 1B, may be received. Device 50 is generally a network element with processing capability and, in one embodiment, may be a routing device. It should be appreciated, however, that device 50 may generally be substantially any device.

Figure 1B:
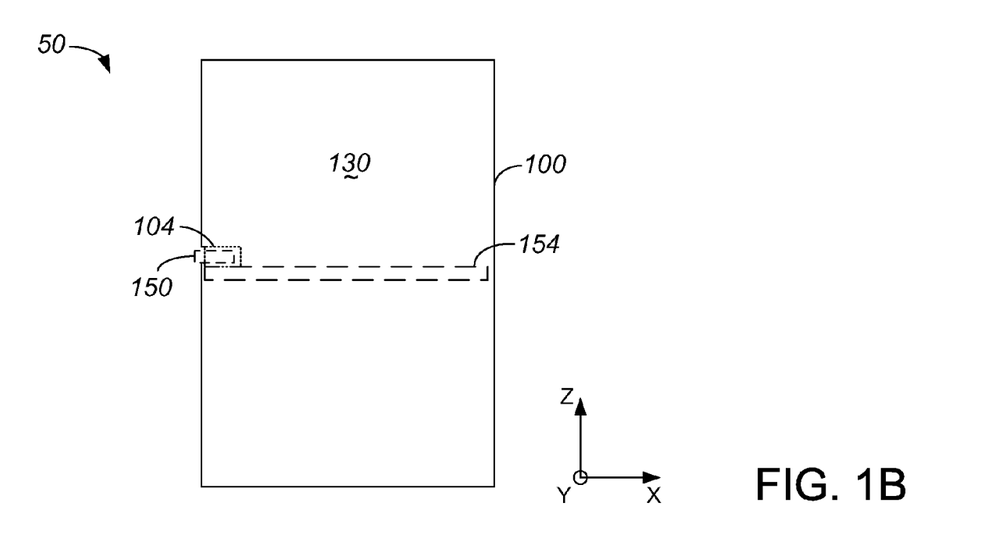
FIG. 1B is a cross-sectional side-view representation of a device, i.e., device 50 of FIG. 1A, in which a module with protection circuitry is inserted at least partially within a receptacle in accordance with an embodiment of the present invention.

Although receptacle 104 is shown as not extending past an exterior surface of device enclosure 100, receptacle 104 may instead protrude with respect to the exterior surface of device enclosure 100, or may be substantially flush with the exterior surface of device enclosure 100. Receptacle 104 is arranged to receive module 150, as shown in FIG. 1B. FIG. 1B is a cross-sectional side-view representation of device 50 in which module 150 is inserted at least partially within receptacle 104 in accordance with an embodiment of the present invention. Receptacle 104 is coupled to a linecard 154 or, more generally, a circuit board that contains circuitry associated with device 50. When module 150 is received within receptacle 104, circuitry contained in module 150 is arranged to cooperate with circuitry on linecard 154, e.g., when power is supplied and device 50 is in operation. In one embodiment, module 150 includes a T1 and E1 connector, as well as protection circuitry for a T1 and E1 telecom interface of linecard 154.

When inserted in receptacle 104, at least a portion of module 150 is located in an interior 130 of device 50. Interior 130 is generally a volume that is defined substantially within device enclosure 100. When module 150 is engaged within receptacle 104, an edge of module 150, which may be an edge associated with a telecom connector that is a part of module 150, may remain accessible from an exterior of device 50 while the rest of module 150 may be contained within interior 130. When circuitry in module 150 fails, disengaging module 150 from receptacle allows the failed circuitry to be readily removed and, subsequently, replaced.

Figure 2:
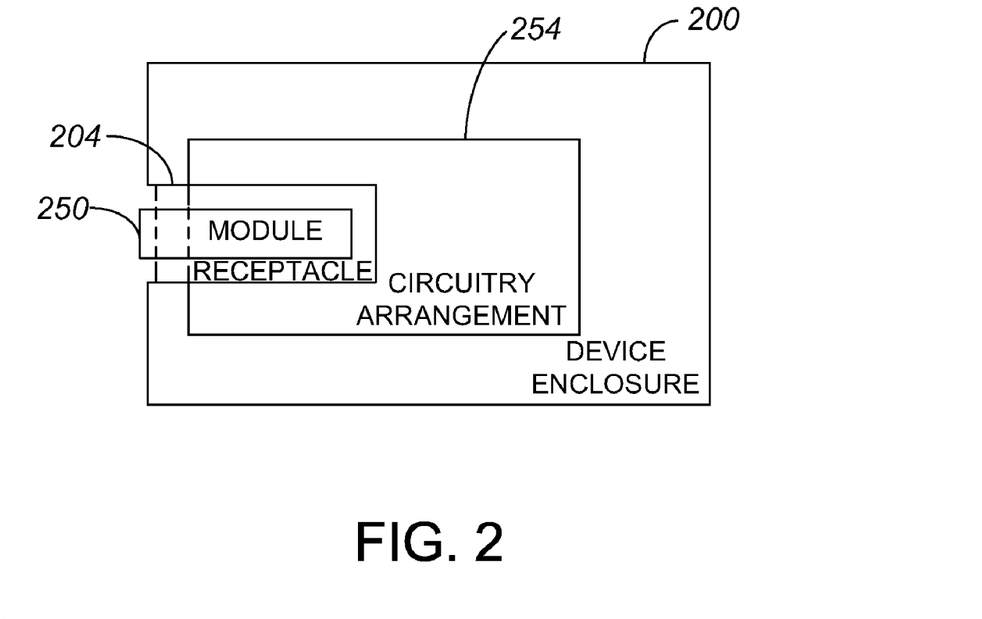
FIG. 2 is a block diagram representation of a device in which a field replaceable module that contains protection circuitry is inserted in accordance with an embodiment of the present invention.

FIG. 2 is a block diagram representation of a device enclosure in which a module is inserted in accordance with an embodiment of the present invention. A device enclosure 200 or box contains a circuitry arrangement 254. Circuitry arrangement 254 may be implemented as a part of a linecard (not shown) such that circuitry arrangement 254 is communicably coupled to circuitry in a module 250 when module 250 is engaged by a receptacle 204. In one embodiment, circuitry arrangement 254 may include a data port interface and other circuitry that is associated with the processing of signals received via module 250, while module 250 may include a telecom connector and circuitry that protects circuitry arrangement 254.

Module 250 may be a small form-factor pluggable (SFP) mechanism, or, alternatively, a similarly sized or smaller mechanism. As will be appreciated by those skilled in the art, an SFP mechanism may be a compact optical transceiver that provides an interface to a fiber. Receptacle 204 may be a cage that positively retains module 250 when module 250 is retained therein. One embodiment of a receptacle will be described below with reference to FIG. 5.

Figure 3A:
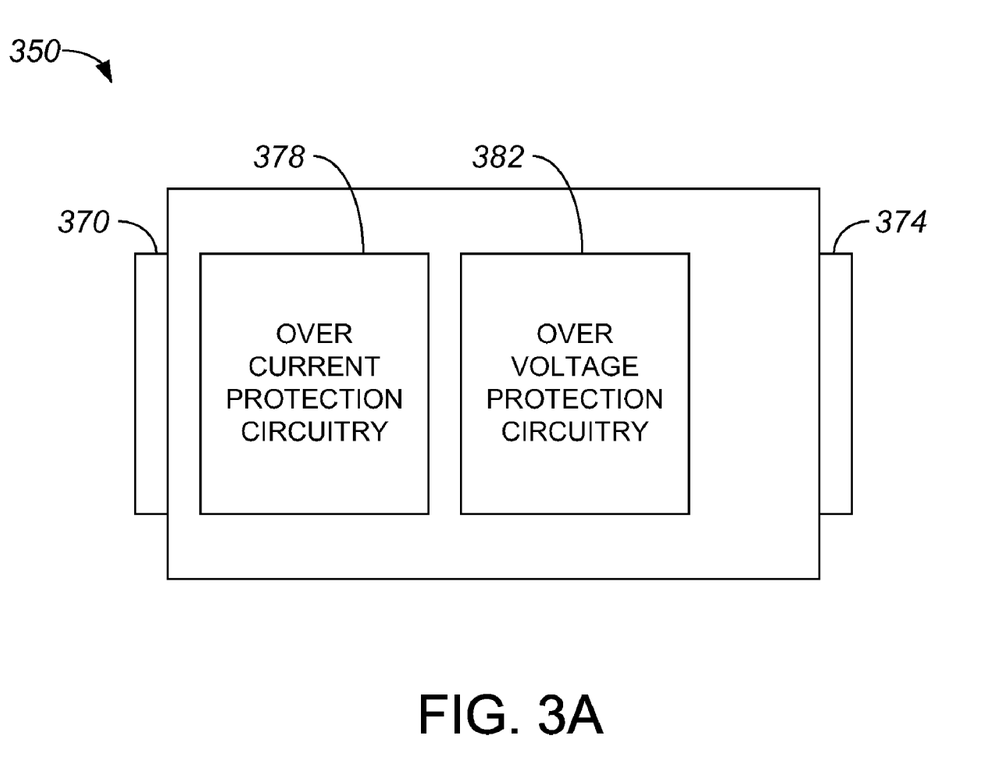
FIG. 3A is a block diagram representation of a first module that contains protection circuitry in accordance with an embodiment of the present invention.

As previously mentioned, a field replaceable module may include protection circuitry for a telecom interface. With reference to FIG. 3A, a first module that contains protection circuitry will be described in accordance with an embodiment of the present invention. A module 350 includes a telecom connector 370 that is arranged to receive a connection to a telecom network. The configuration of telecom connector 370 may vary, as for example based upon the type of communication supported by module 350. Telecom connector 370 may be substantially any telecom or data port connector. By way of example, telecom connector 370 may be a T1 and E1 interface or a 10/100/1000 data port. If telecom connector 370 is a T1 and E1 interface, telecom connector 370 may be an RJ-type connector, e.g., a RJ-45 connector. An equipment connector 374 allows module 350 to be connected or otherwise interfaced to equipment or a device (not shown) within which module 350 is to be used. In one embodiment, equipment connector 374 may be arranged to interface with substantially any component of a device (not shown) that either obtains signals from or provides signals to a telecom network.

Module 350 also includes over current protection circuitry 378 and over voltage protection circuitry 382. Over current protection circuitry 378 is arranged to protect against current surges, e.g., current surges of approximately 1.25 Amps or more, while over voltage protection circuitry 382 is arranged to protect against voltage surges, e.g., voltage surges of approximately 50 Volts or more.

Over current protection circuitry 378, which may include fuse components, is arranged to interrupt externally generated relatively high current events which may propagate on telecommunications lines (not shown) coupled to telecom connector 370. When a relatively high current event occurs, over current protection circuitry 278 typically fails, or otherwise needs to be replaced. Over voltage protection circuitry 382, which may include solid state protection components such as SIDACtors® which are available commercially from Littelfuse Corporation of Des Plaines, Ill., is arranged to clamp externally generated relatively high potential surges, i.e., surges passing through telecom connector 370, to prevent damage to a device to which module 350 is coupled via connector 374. When a relatively high potential surge occurs, over voltage protection circuitry 382 generally clamps the surge, thus allowing potentially high valued currents to flow through over current protection circuitry 278.

Over current protection circuitry 378 and over voltage protection circuitry 382 are generally implemented in cooperation with signal transformer circuitry that provides electrical isolation between a telecom network that is accessible through telecom connector 370 and a device that is accessible through equipment connector 374. The signal transformer circuitry may be included in the device that accepts module 350.

Figure 3B:
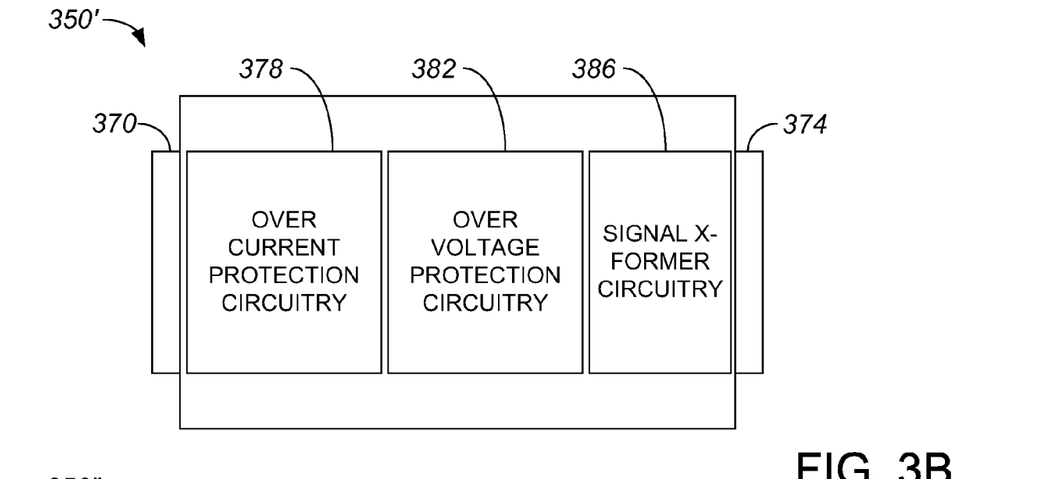
FIG. 3B is a block diagram representation of a second module that contains protection circuitry in accordance with an embodiment of the present invention.

In lieu of being included in a device to which a field replaceable module is coupled, signal transformer circuitry may instead be a part of the field replaceable module. FIG. 3B is a block diagram representation of a module that contains over current protection circuitry, over voltage protection circuitry, and signal transformer circuitry in accordance with an embodiment of the present invention. A module 350' includes telecom connector 370, equipment connector 374, over current protection circuitry 378, and over voltage protection circuitry 382. Additionally, module 350' includes signal transformer circuitry 386. As previously mentioned, signal transformer circuitry 386 may electrically isolate a device connected to equipment connector 374 from a telecom network that is accessible through telecom connector 370. Signal transformer circuitry 386, in effect, prevents a relatively high amount of power from being drawn from or passed to either the device or the telecom network.

Figure 3C:
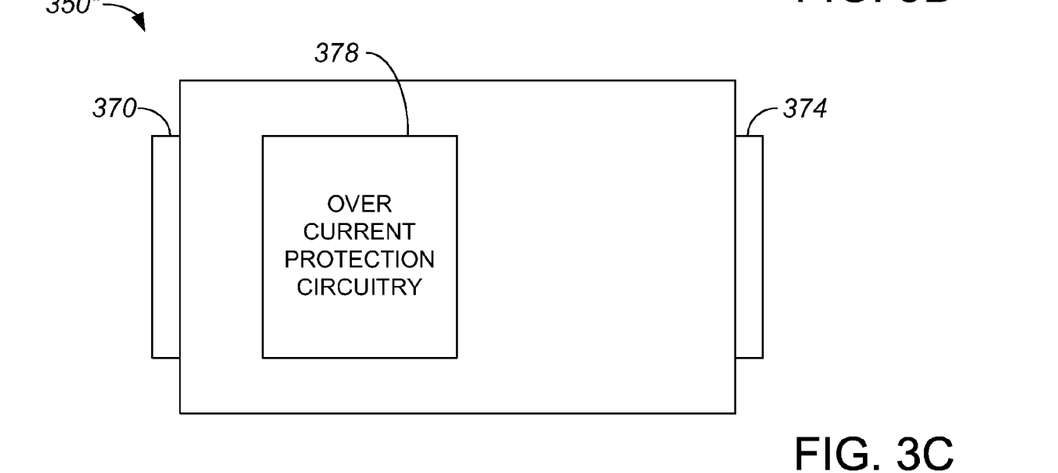
FIG. 3C is a block diagram representation of a second module that contains protection circuitry in accordance with an embodiment of the present invention.

Like signal transformer circuitry, voltage protection circuitry may also be included in a device that accepts a field replaceable module, rather than in the field replaceable module. As will be appreciated by those skilled in the art, over current protection circuitry is often damaged during a high energy event, while over voltage protection circuitry remains relatively unharmed. By way of example, a lightning strike or other high voltage event may become coupled onto a metallic interface such that over voltage protection on that interface clamps high voltage surges to ground. When high voltage surges are clamped to ground, an over current event may occur, thereby causing over current protection circuitry to fail or otherwise activate. Hence, over voltage protection circuitry may reside on a field replaceable module or in a device which receives the field replaceable module. As shown in FIG. 3C, when voltage protection circuitry and signal transformer circuitry are not include in a module 350", module 350" may include over current protection circuitry 378, telecom connector 370, and equipment connector 374.

Figure 4:
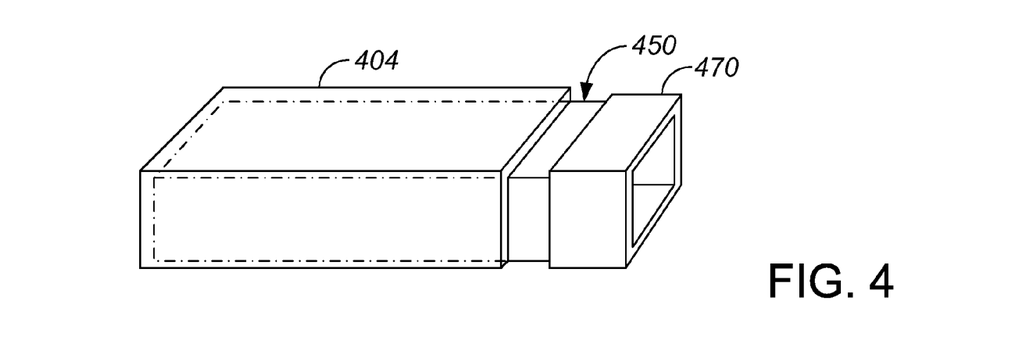
FIG. 4 is a diagrammatic representation of a module that contains protection circuitry which is inserted in a receptacle in accordance with an embodiment of the present invention.

When a field replaceable module is engaged within a receptacle, a telecom connector of the module may extend out of the receptacle. In other words, only portions of a field replaceable module may be contained by, or be in contact with, a receptacle. FIG. 4 is a diagrammatic representation of a module that contains protection circuitry and is engaged by a receptacle in accordance with an embodiment of the present invention. A receptacle 404, which may be located within a device enclosure of a device, is arranged to receive a module 450. Module 450 includes a telecom connector 470 that, when module is received within receptacle 404, extends past receptacle 404. Receptacle 404, in one embodiment, may include mechanisms (not shown) which allow module 450 to be positively retained by receptacle 404. Such mechanisms may include, but are not limited to, retention tabs (not shown) that engage openings (not shown) associated with module 450, or openings (not shown) that engage retention tabs (not shown) associated with module 450.

Figure 5:
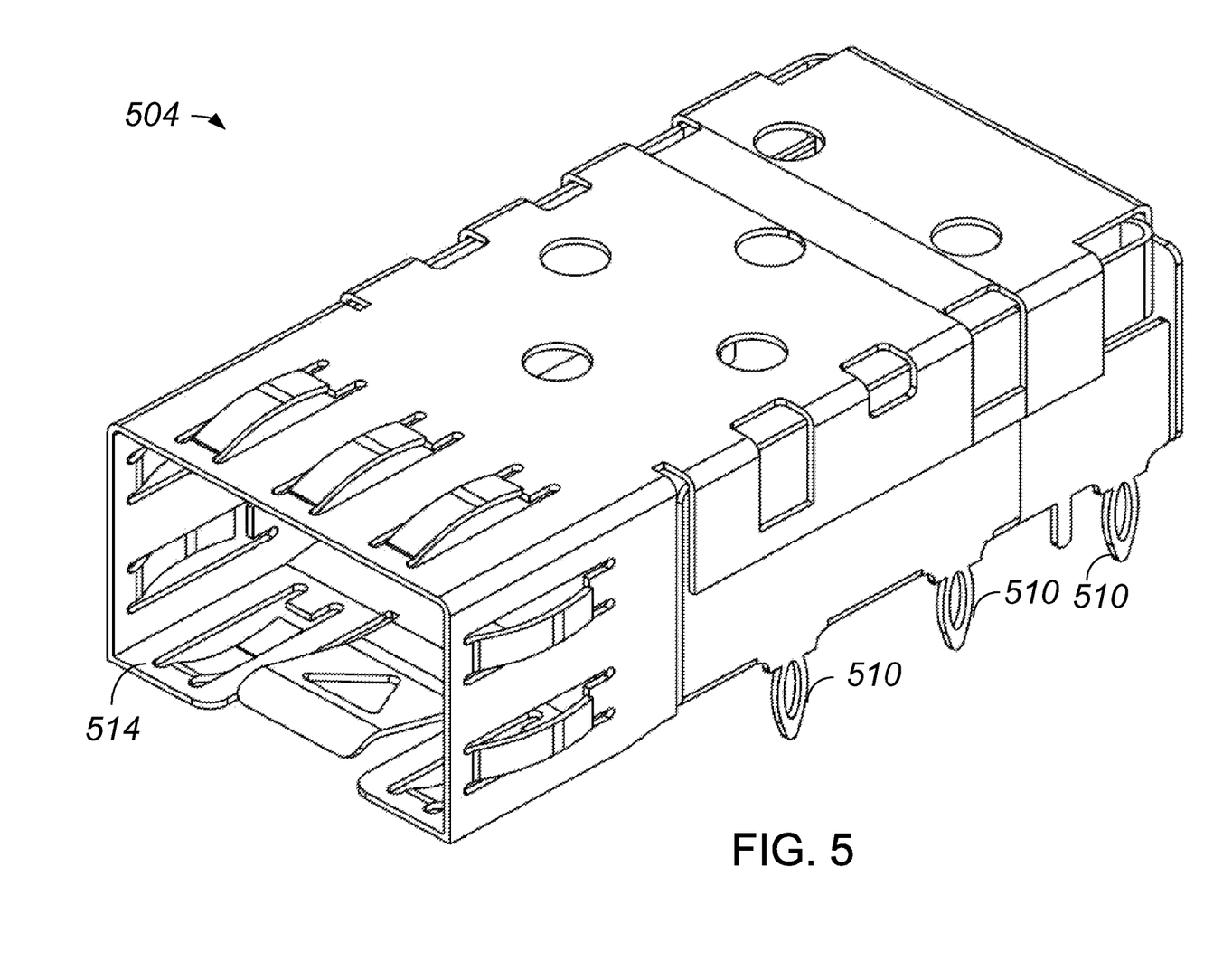
FIG. 5 is a diagrammatic representation of a receptacle that is arranged to receive a module that contains protection circuitry in accordance with an embodiment of the present invention.

The configuration of receptacle 404 and module 450 may vary widely. Referring next to FIG. 5, one embodiment of a receptacle that is suitable for receiving a field replaceable module will be described in accordance with an embodiment of the present invention. A receptacle 504 is a substantially cage-like structure that has a cavity 514 into which a module (not shown) may be inserted. Receptacle 504 may include a plurality of legs 510 that may allow receptacle 504 to be inserted into, and retained by, a linecard.

Figure 6:
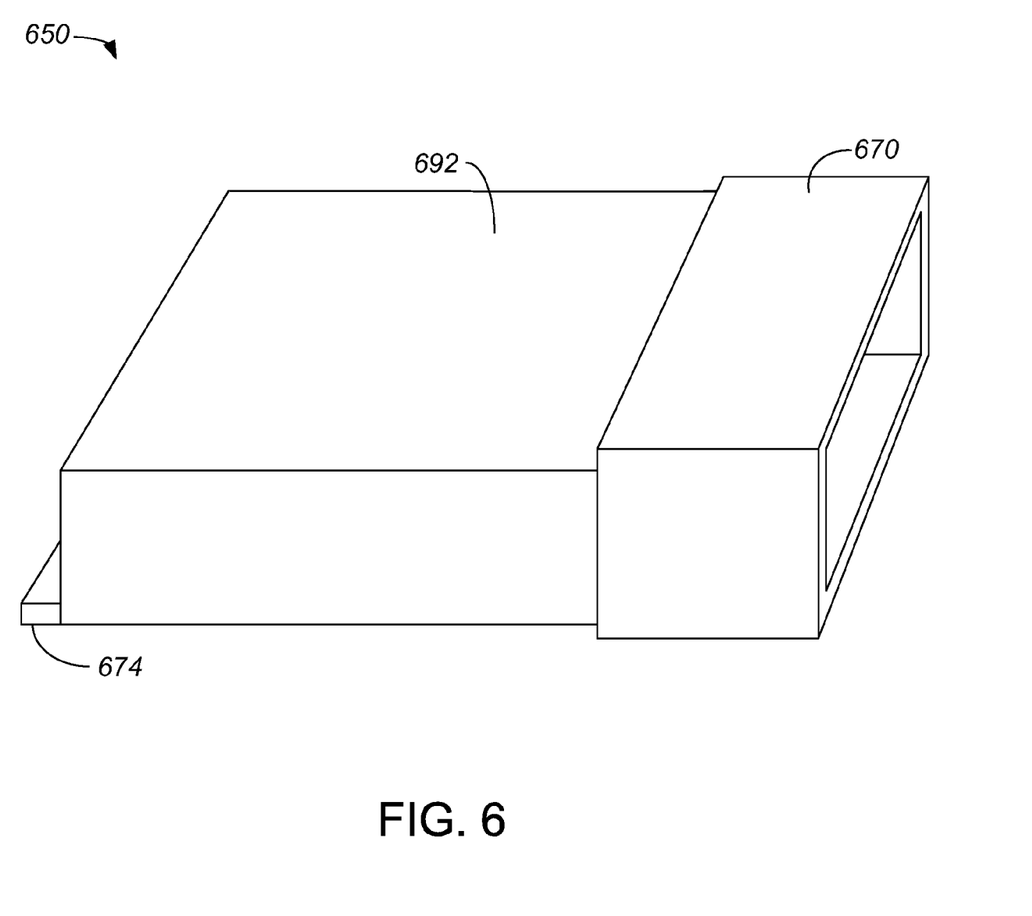
FIG. 6 is a diagrammatic representation of a module that contains protection circuitry in accordance with an embodiment of the present invention.

FIG. 6 is a diagrammatic perspective representation of a module that contains protection circuitry in accordance with an embodiment of the present invention. A module 650 includes a telecom connector 670 or, more generally, a port connection, e.g., a data port connection. Telecom connector 670 is generally arranged to receive a cable, e.g., a twisted pair cable, which couples module 650 to a telecom network. For T1 and E1 interfaces, telecom connector 670 may be a RJ-45 connector, although it should be appreciated that telecom connector 670 may be substantially any suitable connector.

Module 650 also includes an equipment connector 674 that may be coupled to a linecard (not shown) when body 692 is at least partially positioned within a receptacle (not shown). In one embodiment, equipment connector 674 may be an edge connector that is arranged to be retained by an edge reader of a linecard (not shown). A body 692 of module 650 encloses protection circuitry, i.e., protection circuitry that protects a telecom interface with which module 650 is in communication with via equipment connector 674.

Figure 7:
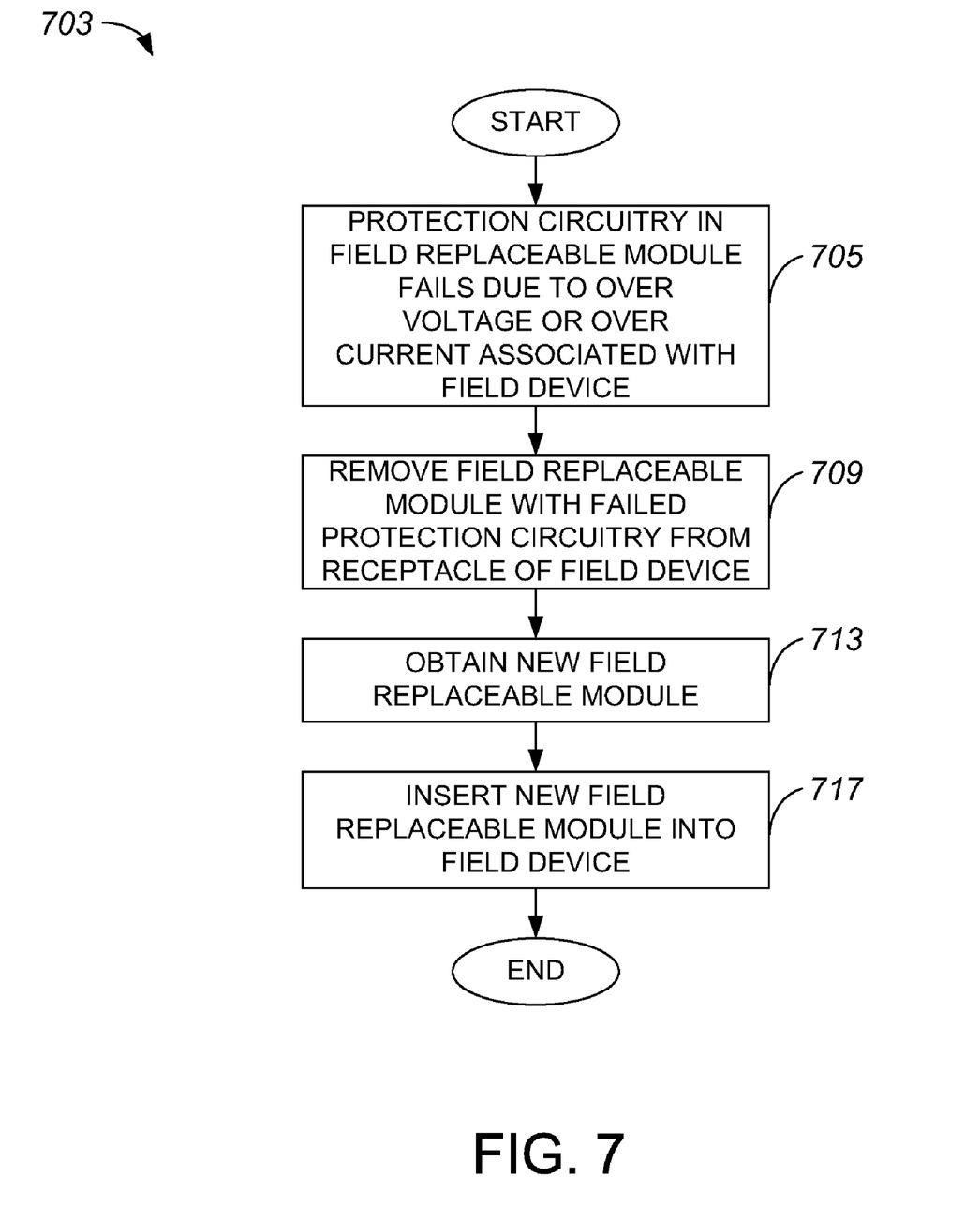
FIG. 7 is a process flow diagram which illustrates one method of replacing protection circuitry associated with a device in accordance with an embodiment of the present invention.

With reference to FIG. 7, one method of servicing a device that uses a field replaceable module will be described in accordance with an embodiment of the present invention. A process 703 of servicing a field device begins at step 705 in which protection circuitry contained within a field replaceable module fails. The failure of the protection circuitry, in one embodiment, may correspond to a voltage surge or a current surge. Circuitry that may fail may include fuse components which fail due to over current and over voltage protection components which effectively compensate for over voltage. When a high voltage condition occurs, over voltage protection components such as SIDACtors® typically clamp the surges to ground, which allows a relatively high fault current to flow to ground. Upon the relatively high fault current flowing to ground, over current protection components such as fuse components may interrupt any excessive current flow.

Once the protection circuitry in the field replaceable module has failed, the field replaceable module may be disengaged in step 709 from its receiving receptacle. Then, in step 713, a new field replaceable module is obtained. The new field replaceable module effectively replaces the field replaceable module that was removed in step 709. In step 717, the new field replaceable module is inserted, i.e., into a receiving receptacle, in the field device, and the process of servicing the field device is completed.

While a field replaceable module such as an SFP module, or a module that is smaller than an SFP module, has been described as containing protection circuitry, it should be appreciated that such a module may generally contain substantially any circuitry which may be replaced in field, e.g., in a harsh or otherwise highly inaccessible environment. A module that contains field replaceable circuitry, when interfaced internally within a device enclosure, may physically be substantially within an interior defined by the device enclosure. Alternatively, the module may partially protrude from the device enclosure when interfaced within the device enclosure.

Figure 8A:
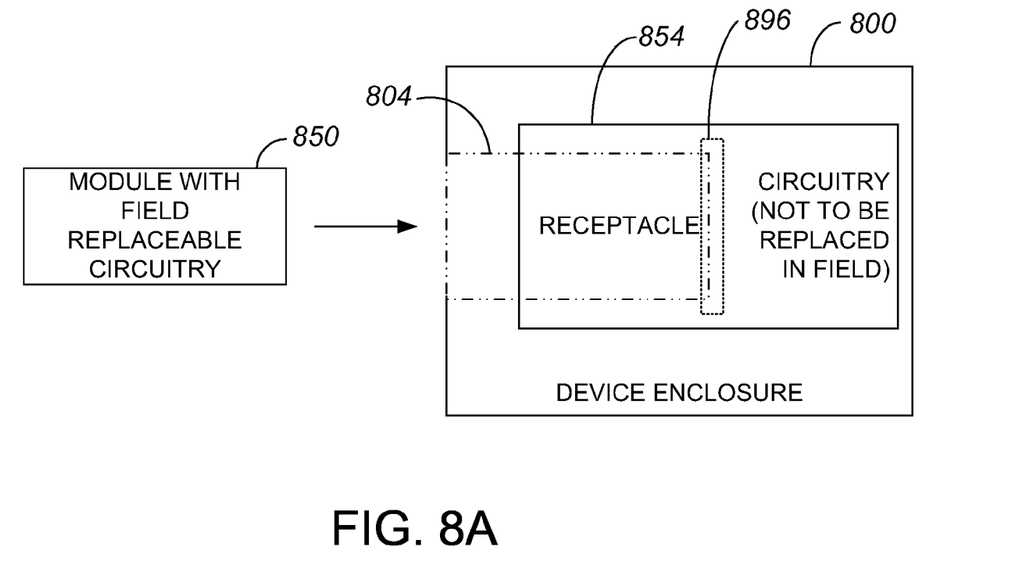
FIG. 8A is a diagrammatic representation of a device enclosure that is arranged to receive a module with replaceable circuitry such that the module does not extend past the outline of the device enclosure when inserted in accordance with an embodiment of the present invention.

FIG. 8A is a diagrammatic representation of a device enclosure that is arranged to receive a field replaceable module such that the module is physically substantially within a volume defined by the device enclosure in accordance with an embodiment of the present invention. A device enclosure 800 is a frame or a box that substantially encloses circuitry 854. Circuitry 854 is generally not arranged to be replaced without opening device enclosure 800, and may include circuitry associated with telecom interfaces or data ports. An interface arrangement 896 allows field replaceable circuitry included in a module 850 to be communicably interfaced with circuitry 854 when module 850 is inserted in receptacle 804. Circuitry 854, interface arrangement 896, and receptacle 804 may be included on an interface linecard. Field replaceable circuitry included in module 850 may be substantially any circuitry, and is not limited to being protection circuitry.

When module 850 is received within receptacle 804, module 850 is arranged such that an outside edge of module 850, e.g., an edge of module 850 associated with a telecom connector (not shown), is either substantially flush with an exterior surface of device enclosure 800 or slightly recessed with respect to the exterior surface of device enclosure 800.

Figure 8B:
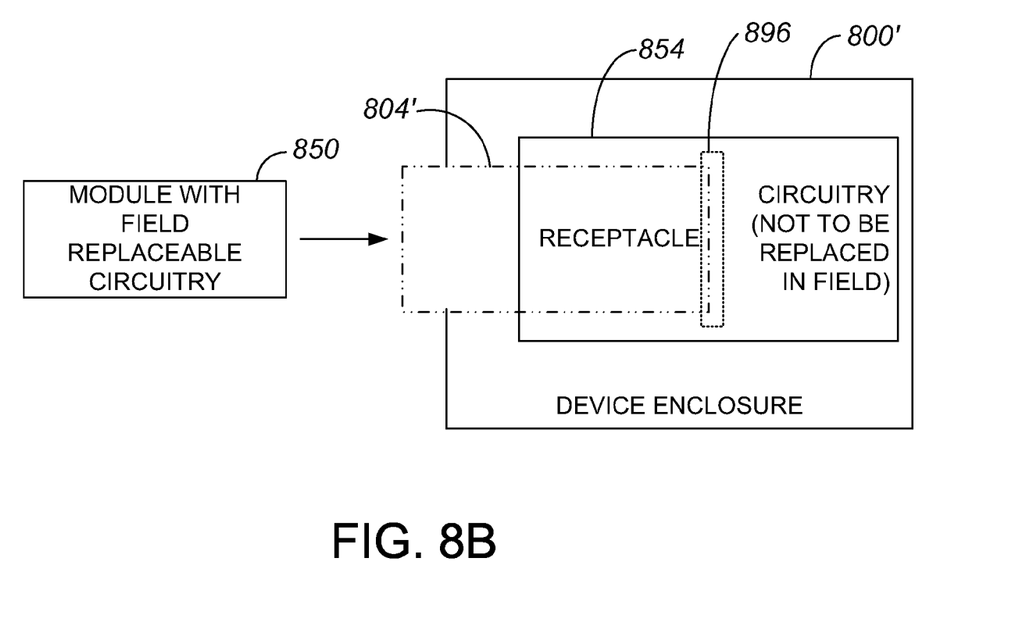
FIG. 8B is a diagrammatic representation of a device enclosure that is arranged to receive a module with replaceable circuitry such that a portion of the module may extend past the outline of the device enclosure when inserted in accordance with an embodiment of the present invention.

FIG. 8B is a diagrammatic representation of a device enclosure that is arranged to receive a module with replaceable circuitry such that a portion of the module may extend past the external surface of the device enclosure when inserted in accordance with an embodiment of the present invention. A device enclosure 800' includes circuitry 854. Circuitry 854 cooperates with field replaceable circuitry that is provided by module 850 when module 850 is inserted at least partially within a receptacle 804'. Receptacle 804' may be arranged such that when module 850 is inserted therein, an edge of module 850, protrudes past an external surface of device enclosure 800'. When module 850 protrudes past an external surface of device enclosure 800', the removal of module 850 when the field replaceable circuitry contained in module 850 fails may be facilitated.

Although only a few embodiments of the present invention have been described, it should be understood that the present invention may be embodied in many other specific forms without departing from the spirit or the scope of the present invention. By way of example, while a field replaceable module has generally been described as being an SFP module or a module that is smaller than an SFP module, a field replaceable module may be substantially any size. That is, a field replaceable module is not limited to being an SFP module or a module that is smaller than an SFP module. In one embodiment, a field replaceable module may be sized similarly to a gigabit interface converter (GBIC).

While a field replaceable module has been described as having a telecom interface, a field replaceable module is not limited to having a telecom interface. For instance, a field replaceable module may have substantially any suitable communications interface. A suitable interface may be a digital interface, such as a T1 or E1 interface, or an analog interface, such as a plain old telephone service (POTS) interface.

A field replaceable module has been described as including over current protection circuitry and over voltage protection circuitry and, in some instances, signal transformer circuitry. It should be appreciated, however, that a field replaceable module may generally include circuitry in addition to, or in lieu of, protection circuitry. Alternatively, a field replaceable module may include over current protection circuitry but not over voltage protection circuitry, as discussed above with respect to FIG. 3C, or over voltage protection circuitry but not over current protection circuitry.

A network device which is arranged to accept a substantially internal, field replaceable module may be substantially any device. In one embodiment, the device may be substantially any suitable telecommunications device, e.g., a router. Further, a device which uses a substantially internal, field replaceable module is not limited to being a network device and may, instead, be a device that is a standalone device.

A field replaceable module may include a variety of different features that are arranged to enable the field replaceable module to be readily, but securely, inserted into a network device. For example, a field replaceable module may include a locking mechanism that substantially automatically engages the network device once the field replaceable module is in place within a receptacle. Such a locking mechanism may be automatically or manually "unlocked" or otherwise disengaged upon a failure of circuitry within the field replaceable module. In general, a locking mechanism may be any suitable mechanism.

The steps associated with the methods of the present invention may vary widely. Steps may be added, removed, altered, combined, and reordered without departing from the spirit of the scope of the present invention. Therefore, the present examples are to be considered as illustrative and not restrictive, and the invention is not to be limited to the details given herein, but may be modified within the scope of the appended claims.

What is claimed is:

1. A device comprising:
    an enclosure, the enclosure being arranged to define an interior of the device;
    a first arrangement, the first arrangement being located in the interior;
    a receptacle, the receptacle being coupled to the first arrangement; and
    a protection circuitry arrangement having an interface that is removably coupled to the receptacle such that at least a portion of the protection circuitry arrangement is disposed in the interior.

2. The device of claim 1 wherein the first arrangement is a data port interface.

3. The device of claim 2 wherein the data port interface is a T1/E1 interface.

4. The device of claim 1 wherein the protection circuitry arrangement includes circuitry capable of providing over voltage protection and circuitry capable of providing the first arrangement with over current protection.

5. The device of claim 4 wherein the protection circuitry arrangement further includes a transformer arrangement.

6. The device of claim 1 wherein the protection circuitry arrangement is a small form-factor pluggable device.

7. The device of claim 1 wherein the enclosure includes an exterior surface that defines an exterior of the device, and the interior of the device is not accessible from the exterior of the device.

8. The device of claim 7 wherein an outer edge of the protection circuitry arrangement is accessible from the exterior of the device.

9. The device of claim 1 wherein the protection circuitry arrangement includes a telecommunications connector and an edge connector, the edge connector being arranged to communicably interface the protection circuitry arrangement and the first arrangement.

10. A device comprising:
    an enclosure, the enclosure having being arranged to define an interior of the device;
    a telecommunications interface, the telecommunications interface being located in the interior, wherein the telecommunications interface does not include protection circuitry; and
    a receptacle, the receptacle being coupled to the telecommunications interface, the receptacle being positioned in the interior, wherein the receptacle is arranged to removably engage the protection circuitry therein, the protection circuitry being arranged to protect the telecommunications interface against at least one selected from the group including a current surge and a voltage surge.

11. The device of claim 10 wherein the telecommunications interface includes signal transformer circuitry.

12. The device of claim 10 wherein the telecommunications interface is a T1/E1 interface.

13. A module comprising:
a first connector, the first connector being arranged to be interfaced with a telecommunications line;
a second connector, the second connector being arranged to interface internally with a device, wherein the device is arranged to be protected by the module;
over current protection circuitry, wherein the over current protection circuitry is arranged to interrupt a current surge event associated with the telecommunications line; and
over voltage protection circuitry, the over voltage protection circuitry being arranged to interrupt a voltage surge event from passing through the second connector.

14. The module of claim 13 further including:
signal transformer circuitry, wherein the signal transformer circuitry is arranged to electrically isolate the telecommunications line from the device.

15. The module of claim 13 wherein the first connector is an RJ-45 connector and the second connector is an edge connector.

16. The module of claim 13 wherein the module is a small form-factor pluggable (SFP) device.

17. A method of replacing circuitry in a device, the circuitry being encapsulated in a first module, the first module being removably coupled to a data port interface linecard within the device and arranged to be at least partially internal to the device, the method comprising:
removing the first module, wherein removing the first module includes disengaging the first module from a receptacle of the data port interface linecard, the receptacle being internal to the device; and
inserting a second module, wherein inserting the second module includes engaging the second module with the receptacle.

18. The method of claim 17 wherein the first module includes a telecommunications connector and protection circuitry, the protection circuitry being arranged to protect the data port interface linecard, the protection circuitry being arranged to be internal to the device when the first module is removably coupled to the data port interface linecard.

19. The method of claim 18 wherein the data port interface is a T1/E1 interface.

20. The method of claim 18 further including:
determining when the protection circuitry has failed, wherein the first module is removed if it is determined that the protection circuitry has failed.

21. A device comprising:
means for providing a telecommunications interface,
means for enclosing the telecommunications interface; and
means for protecting the telecommunications interface, the means for protecting the telecommunications interface including a first connector, wherein the means for protecting the telecommunications interface are removably coupled to the telecommunications interface through the first connector and are at least partially enclosed in the telecommunications interface.

22. The device of claim 21 wherein the telecommunications interface is a T1/E1 interface, and the means for protecting the telecommunications interface include a T1/E1 connector.

23. The device of claim 21 wherein the means for protecting the telecommunications interface include means for providing over voltage protection means fir providing over current protection.

24. The device of claim 23 wherein the means for protecting the telecommunications interface further includes means for providing electrical isolation for the device.

* * * * *